(12) United States Patent  
Kitamura

(10) Patent No.: US 7,767,513 B2
(45) Date of Patent: Aug. 3, 2010

(54) METHOD OF MANUFACTURING SEMICONDUCTOR DEVICE AND SEMICONDUCTOR DEVICE

(75) Inventor: Hiroyuki Kitamura, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 197 days.

(21) Appl. No.: 12/050,719

(22) Filed: Mar. 18, 2008

(65) Prior Publication Data

US 2008/0272444 A1    Nov. 6, 2008

(30) Foreign Application Priority Data

Mar. 22, 2007    (JP) ............................. 2007-074149

(51) Int. Cl.
*H01L 21/8238*    (2006.01)
(52) U.S. Cl. ................ 438/199; 438/791; 257/E21.293
(58) Field of Classification Search ................ 438/199, 438/197, 791, 792; 257/E21.293
See application file for complete search history.

(56) References Cited

U.S. PATENT DOCUMENTS

2007/0105297 A1*    5/2007    Jeong et al. .................. 438/197

FOREIGN PATENT DOCUMENTS

JP    2005-302892 A    10/2005

* cited by examiner

*Primary Examiner*—Thanhha Pham
(74) *Attorney, Agent, or Firm*—Sughrue Mion, PLLC

(57) ABSTRACT

A method of manufacturing a semiconductor device of the present invention is a method of manufacturing a semiconductor device that is provided with a step of successively forming a gate insulating film and a gate electrode on a semiconductor substrate and a step of forming a silicon nitride film that covers at least the gate insulating film and the side portions of the gate electrode, in which the silicon nitride film is formed by laminating a plurality of silicon nitride layers by repeating a step of forming a silicon nitride layer of a predetermined thickness by the low-pressure chemical vapor deposition method and a step of exposing the silicon nitride layer to nitrogen.

2 Claims, 4 Drawing Sheets

METHOD OF MANUFACTURING SEMICONDUCTOR DEVICE AND SEMICONDUCTOR DEVICE

BACKGROUND OF THE INVENTION

1. Field of the Invention

The present invention relates to a method of manufacturing a semiconductor device and a semiconductor device.

Priority is claimed on Japanese Patent Application No. 2007-74149, filed Mar. 22, 2007, the content of which is incorporated herein by reference.

2. Description of Related Art

In recent years, large scale integration (hereinafter LSI) has been adopted for the main components of computers and electrical appliances, in which a plurality of MOS transistors and resistors and the like are integrated on one chip.

Even in LSI, for example rapid miniaturization is proceeding in elements such as DRAM (Dynamic Random Access Memory).

FIG. 10 shows a cross-sectional mimetic diagram of a MOS transistor that constitutes a DRAM memory cell.

As shown in FIG. 10, an STI (Shallow-Trench Isolation) element isolation region 101 is formed at a predetermined region on the surface of a semiconductor substrate 100. Also, a P-well layer 102 that is adjacent to the element isolation region 101 is formed in the semiconductor substrate 100. A gate insulating film 103 that consists of silicon oxide is formed on the P-well layer 102 of the semiconductor substrate 100, and on that for example is formed a gate electrode 104 that consists of laminating a P-type polysilicon layer 104a and a metal layer 104b such as W. Then, a silicon nitride film 105 is formed so as to cover the gate electrode 104 and end portions 103a of the gate insulating film 103. A source-drain diffusion layer 106 is formed in the semiconductor substrate 100 adjacent to the gate electrode 104.

An interlayer insulating film 107 that consists of silicon oxide is for example formed so as to cover the semiconductor substrate 100 and the silicon nitride film 105, and the surface of the interlayer insulating film 107 is made flat by chemical mechanical polishing (CMP). Furthermore, a contact hole 107a is provided in the interlayer insulating film 107 by dry etching. A contact plug 110 which consists of a high melting point metal etc. is filled in the contact hole 107a, and this contract plug 110 is connected to the source-drain diffusion layer 106.

The source-drain diffusion layer 106 is formed by implanting an N-type impurity in the P-well layer 102 of the semiconductor substrate 100 by an ion implanting method. At this time, the implanted N-type impurity diffuses in the semiconductor substrate 100 and extends to the underside of the end portions 103a of the gate insulating film 103. In this way, an overlap region OL of the gate and the drain is formed in the semiconductor device shown in FIG. 10.

As a method for forming the silicon nitride film 105, the chemical vapor deposition (CVD) method using a mixed gas in which silane ($SiH_4$), dichlorosilane ($SiH_2Cl_2$), ammonia ($NH_3$), nitrogen ($N_2$), hydrogen ($H_2$), etc, are suitably nixed as a reactant gas is commonly known, and is often employed. In the silicon nitride film 105 that is formed with the CVD method, hydrogen atoms are contained, and so Si—H bonds exist stemming from these hydrogen atoms (refer to Japanese Unexamined Patent Application, First Publication, (JP-A) No. 2005-302892).

As shown in FIG. 10, in the state of the silicon nitride film 105 that includes the Si—H bonds being connected to the end portions 103a of the gate insulating film 103, cases of hydrogen atoms desorbing from the silicon nitride film 105 arise. When desorption of hydrogen atoms occurs, the leakage current in the overlap region OL of the gate and the drain increases, and so there has been a risk of the retention of information "1" and reliability of the DRAM decreasing.

The present invention was achieved in view of the above circumstances, and has as its object to provide a semiconductor device that has excellent retention of information "1" and reliability of the DRAM, and a manufacturing method thereof.

SUMMARY OF THE INVENTION

In order to achieve the aforementioned object, the present invention adopts the following constitution.

A method of manufacturing a semiconductor device of the present invention is a method of manufacturing a semiconductor device that is provided with a step of successively forming a gate insulating film and a gate electrode on a semiconductor substrate and a step of forming a silicon nitride film, characterized by having a step of forming a silicon nitride layer of a predetermined thickness by the low-pressure chemical vapor deposition method on a portion that covers at least the gate insulating film and the side portions of the gate electrode; a step of exposing the silicon nitride layer to nitrogen under a decompressed atmosphere; and a step of forming a silicon nitride film that consists of a plurality of laminated silicon nitride layers by repeating the step of forming the silicon nitride layer and the step of exposing the silicon nitride layer to nitrogen.

In the method of manufacturing a semiconductor device of the present invention, the silicon nitride film is preferably formed so as to be connected to the end portions of the gate insulating film that are exposed between the semiconductor substrate and the gate electrode.

The semiconductor device of the present invention is characterized by being manufactured by the method of manufacturing a semiconductor device disclosed above.

Also, the semiconductor device of the present invention is equipped with a MOS transistor that is provided with a gate insulating film that is formed on a semiconductor substrate, a gate electrode that is formed on the gate insulating film, and a silicon nitride film that covers at least the gate insulating film and side portions of the gate electrode and has a hydrogen density of 1 atom % or less.

In the semiconductor device of the present invention, the silicon nitride film is preferably connected to end portions of the gate insulating film that are exposed between the semiconductor substrate and the gate electrode.

By repeating the step that forms a silicon nitride layer and the step that exposes the silicon nitride layer to nitrogen under a decompressed atmosphere according to the aforementioned method of manufacturing a semiconductor device, it is possible to reduce the number of Si—H bonds by expelling hydrogen atoms that are included in the silicon nitride layer. Thereby, there is no risk of an increase in leakage current in an overlap region OL of the gate and drain.

Also, by reducing the number of Si—H bonds that are contained in the silicon nitride layer, it is possible to reduce variations in the threshold voltage of the MOS transistor.

Also, since the hydrogen density of the silicon nitride film that covers the end portions of the gate insulating film is 1 atom % or less according to the aforementioned semiconductor device, there is no risk of an increase in leakage current in the overlap region OL of the gate and drain.

For this reason, in the case of applying the semiconductor device of the present invention to a DRAM, it is possible to raise the retention of information "1" and reliability of the DRAM.

Also, by reducing the number of Si—H bonds that are contained in the silicon nitride layer, it is possible to reduce the variations in the threshold voltage of the MOS transistor.

According to the present invention, it is possible to provide a semiconductor device that has excellent retention of information "1" and reliability of DRAM and a manufacturing method thereof.

DETAILED DESCRIPTION OF THE INVENTION

Hereinbelow, a semiconductor device and a method of manufacturing the same that is an embodiment of the present invention shall be described with reference to the drawings. The present embodiment describes the case of applying the semiconductor device to a DRAM element. Note that the drawings referred to in the below description are for describing the semiconductor device of the present embodiment and a method of manufacturing the same, and the size, thickness, and dimensions of each part that is illustrated may differ with the dimensional relationship of each portion in an actual semiconductor device and the method of manufacturing the same.

Method of Manufacturing a Semiconductor Device

FIGS. 1 to 8 are process drawings for describing the method of manufacturing a semiconductor device of the present embodiment. FIGS. 1 to 8 are process drawings showing the formation steps of a memory cell portion in a DRAM element. The method of manufacturing a semiconductor device of the present embodiment mainly consists of a gate electrode formation step which forms a gate insulating film and a gate electrode on a semiconductor substrate, a silicon nitride film formation step that forms a silicon nitride film that covers the gate insulating film and the gate electrode, and a later step that forms a contact plug and capacitor portion. Hereinbelow, each step shall be described in turn.

[Gate Electrode Formation Step]

First, the step of forming the gate insulating film and the gate electrode (gate electrode formation step) shall be described.

Figure 1:
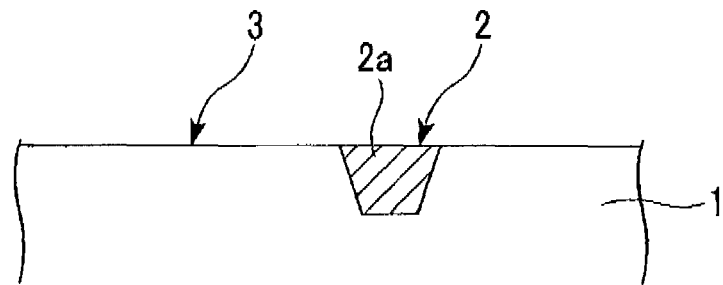
FIG. 1 is a cross-sectional view showing the gate electrode formation step in the method of manufacturing a semiconductor device according to an embodiment of the present invention.

As shown in FIG. 1, an element isolation region 2 with a depth of 200 to 350 nm is formed by the Shallow-Trench Isolation (STI) method in a semiconductor substrate 1. The element isolation region 2 is formed by a silicon oxide film 2a for element isolation that is embedded in a recessed portion. By the formation of this element isolation region 2, an active region 3 is formed on the semiconductor substrate 1.

Figure 2:
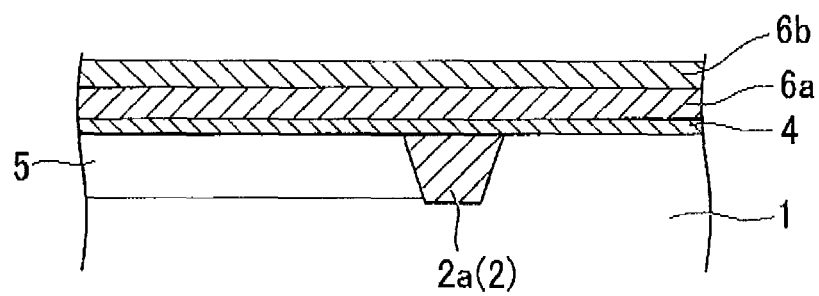
FIG. 2 is a cross-sectional view showing the gate electrode formation step in the method of manufacturing a semiconductor device according to an embodiment of the present invention.

Next, as shown in FIG. 2, a gate insulating film 4 that consists of silicon oxide with a thickness of 5 to 10 nm is formed for example by the chemical vapor deposition (CVD) method or a thermal oxidation method so as to cover the active region 3 and the element isolation region 2 of the semiconductor substrate 1. After that, boron is implanted in the semiconductor substrate 1 to form a P-type well layer 5. After implanting the boron, heat treatment is carried out for damage recovery.

Next, a polycrystal silicon film 6a in which an N-type impurity is contained is formed on the gate insulating film 4 by the CVD method with monosilane ($SiH_4$) and phosphine ($PH_3$) serving as the raw material gas. Next, a high melting point metal film 6b such as tungsten, tungsten nitride, tungsten silicide is formed as a metal film by the sputtering method on the polycrystal silicon film 6a.

Figure 3:
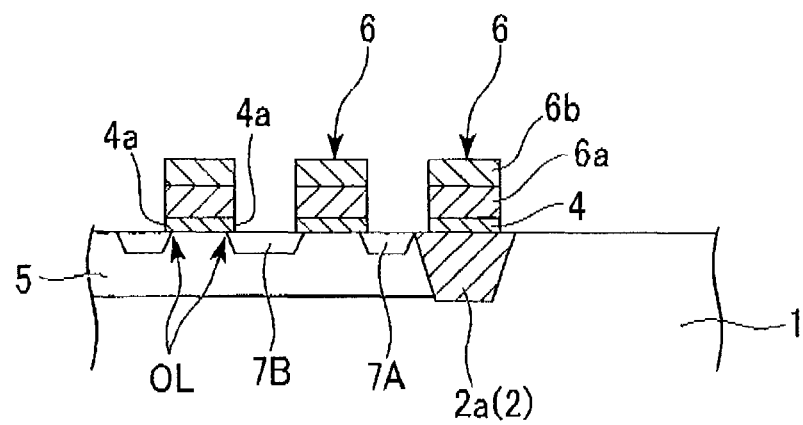
FIG. 3 is a cross-sectional view showing the gate electrode formation step in the method of manufacturing a semiconductor device according to an embodiment of the present invention.
Figure 4:
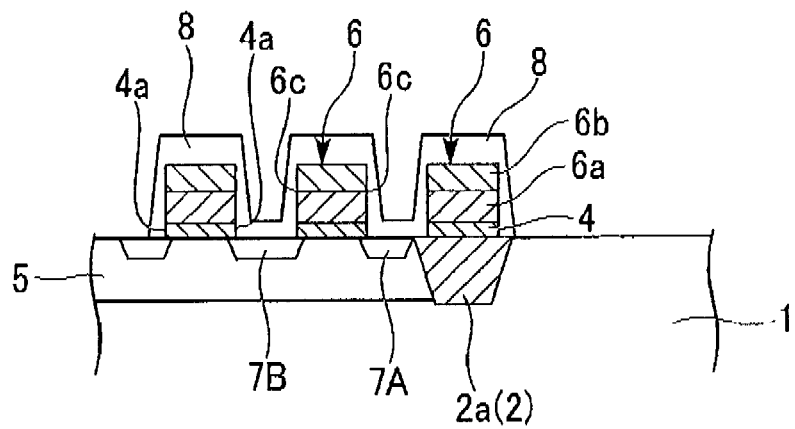
FIG. 4 is a cross-sectional view showing the silicon nitride film formation step in the method of manufacturing a semiconductor device according to an embodiment of the present invention.

Next, a resist that is not illustrated is coated on the high melting point metal film 6b, and using a mask for forming a gate electrode 6, a photoresist pattern (not illustrated) for forming the gate electrode 6 is formed by photolithography. Then, the polycrystal silicon film 6a, the high melting point metal film 6b, and the gate insulating film 4 are etched by anisotropic etching with the photoresist pattern serving as a mask. By doing so, the gate electrode 6 is formed as shown in FIG. 3. By forming the gate electrode 6, end portions 4a of the gate insulating film 4 enter an exposed state between the gate electrode 6 and the semiconductor substrate 1.

Furthermore, as shown in FIG. 3, ion injection of an N-type impurity (for example, arsenic (As)) is performed with the gate electrode 6 serving as a mask, and annealing is performed in a nitrogen atmosphere to form a source region 7A and a drain region 7B.

Since the source region 7A and a drain region 7B are formed by injecting an N-type impurity in the semiconductor substrate 1, the injected N-type impurity diffuses in the semiconductor substrate 1 and extends to the underside of the end portions 4a of the gate insulating film 4. Thus, an overlap region OL of the gate and the drain is formed as shown in FIG. 3.

[Silicon Nitride Film Formation Step]

Next, the step of forming a silicon nitride film (silicon nitride film formation step) that covers the gate insulating film and the gate electrode shall be described.

A silicon nitride film 8 is formed by laminating a plurality of silicon nitride layers by repeating a step that forms a silicon nitride layer of a specified thickness by a low-pressure CVD (LPCVD) method, and a step that exposes the silicon nitride layer to nitrogen under a decompressed atmosphere.

As a means of forming the silicon nitride layer, the LPCVD method state above is preferable. The LPCVD method is performed under the conditions of dichlorosilane ($SiH_2Cl_2$), ammonia ($NH_3$), and nitrogen ($N_2$) serving as the reaction gas, and making the atmosphere a high temperature, decompressed atmosphere of 700° and 1 Torr. The thickness of the silicon nitride layer that is formed by the LPCVD method at one time is suitably set in accordance with the integration density of the DRAM elements. However, when the thickness of the silicon nitride layer is too thick, the desorption of the hydrogen atoms becomes difficult when exposed to nitrogen. The thickness of the silicon nitride layer that is formed at one time is 3 to 6 nm, and preferably 5 nm. When less than 3 nm, the manufacturing throughput drops, and when greater than 6 nm, the desorption effect of the hydrogen atoms becomes insufficient.

After formation of the silicon nitride layer, the silicon nitride layer is exposed to nitrogen under a decompressed atmosphere. The conditions at this time are flowing only nitrogen ($N_2$) in the state of the semiconductor substrate 1 being place in a reactor of a LPCVD apparatus, and making the atmosphere a high temperature, decompressed atmosphere of 700° and 1 Torr. The exposure time is set to 5 to 10 min. in accordance with the thickness of the silicon nitride layer. By reducing the pressure to 0.5 Torr while flowing only nitrogen, the hydrogen atoms in the silicon nitride layer are adsorbed, and the number of Si—H bonds decrease.

By repeating the above process for example three times and laminating a plurality of the silicon nitride layers, the silicon nitride film 8 with a thickness of 15 nm is formed. The thickness of the silicon nitride film can be set to a range of 10 to 25 nm. The number of times to repeat each step may be specified by a relationship between the thicknesses of the silicon nitride layer and the thickness of the silicon nitride film, and is not limited to three times.

The silicon nitride film 8 is formed by laminating a plurality of the silicon nitride layers by the LPCVD method, and is formed also on side portions 6c of the gate electrode 6. The silicon nitride film 8 that is formed on the side portions 6c of the gate electrode 6 functions as a so-called sidewall. The silicon nitride film 8 as this sidewall makes contact with the end portions 4a of the gate insulating film 4 that are exposed between the gate electrode 6 and the semiconductor substrate 1. Accordingly, the silicon nitride film 8 in which the number of Si—H bonds is decreased makes contact with the gate insulating film 4.

[Later Step]

Next, the step of forming the contact plug and capacitor portion (later step) shall be described.

Figure 5:
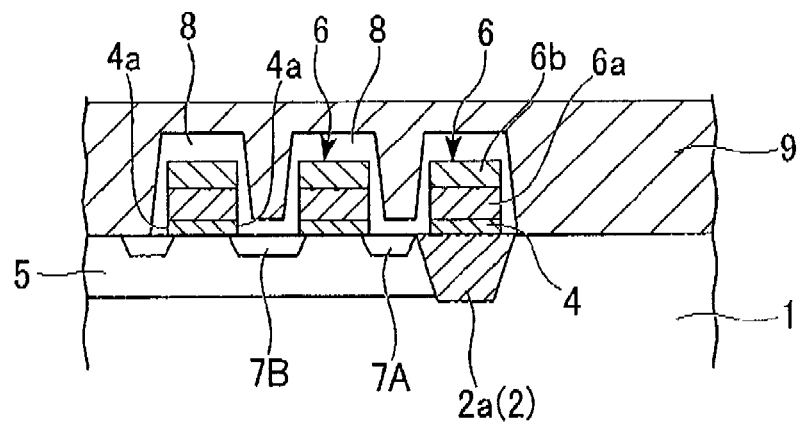
FIG. 5 is a cross-sectional view showing a later step following the step shown in FIG. 4 in the method of manufacturing a semiconductor device according to an embodiment of the present invention.

First, as shown in FIG. 5, a first interlayer insulating film 9 that consists of silicon oxide is formed to a thickness of for example about 600 nm so as to cover the silicon nitride film 8 by for example the LPCVD method. Then, in order to make flat the unevenness arising in the gate electrode 6 and the silicon nitride film 8, the first interlayer insulating film 9 is polished to a thickness of for example 200 nm by the CMP method.

Figure 6:
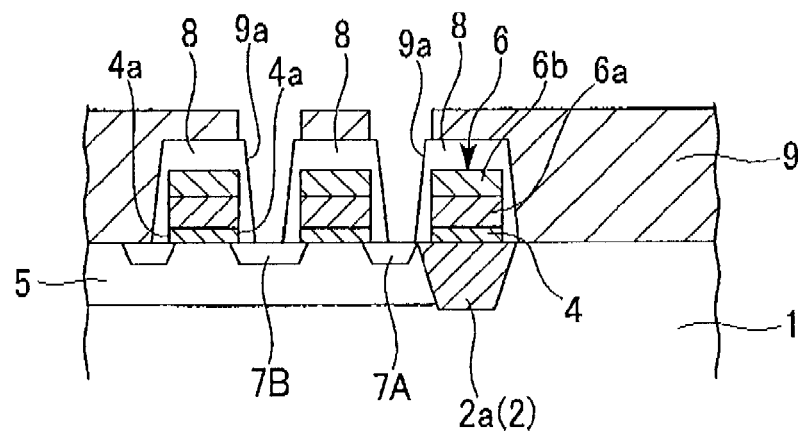
FIG. 6 is a cross-sectional view showing a later step following the step shown in FIG. 5 in the method of manufacturing a semiconductor device according to an embodiment of the present invention.

Next, as shown in FIG. 6, a contact hole 9a is formed on the source region 7A and the drain region 7B of the first interlayer insulating film 9 by performing photolithography and dry etching using the well-known self aligned contact (SAC) method. The contact hole 9a is provided so as to open the silicon nitride film 8 above the source region 7A and the drain region 7B.

Figure 7:
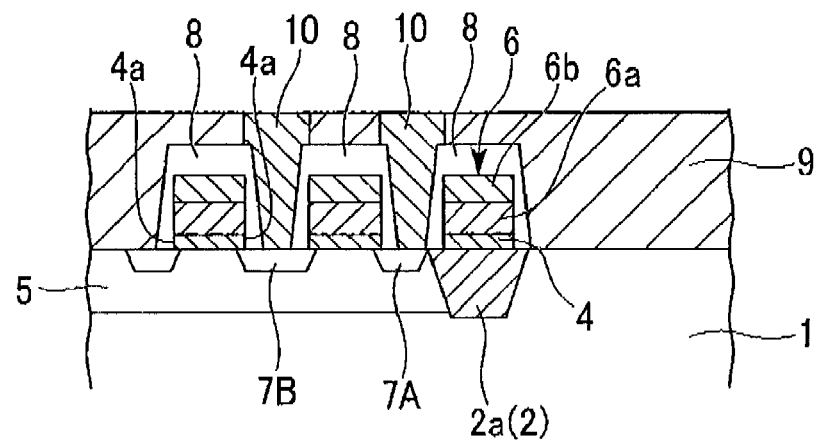
FIG. 7 is a cross-sectional view showing a later step following the step shown in FIG. 6 in the method of manufacturing a semiconductor device according to an embodiment of the present invention.

Next, as shown in FIG. 7, a contact plug 10 is formed in the opened contact hole 9a. After forming a polysilicon layer or an amorphous silicon layer over the entire surface, the contact plug 10 is formed by removing the polysilicon layer or the amorphous silicon layer that is formed on the first interlayer insulating film 9 by the CMP method or an etch-back method.

Figure 8:
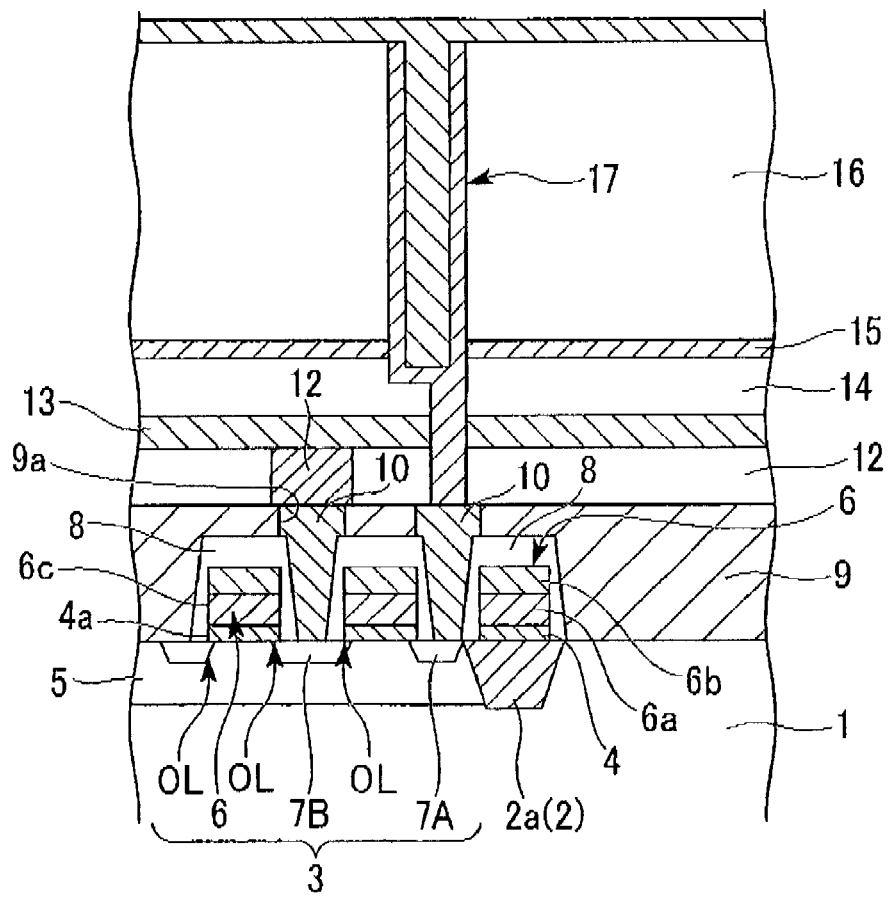
FIG. 8 is a cross-sectional view showing a later step following the step shown in FIG. 7 in the method of manufacturing a semiconductor device according to an embodiment of the present invention.

Next, as shown in FIG. 8, a second interlayer insulating film 11 that consists of silicon oxide is formed for example to a thickness of 200 nm by the LPCVD method so as to cover the contact plug 10 and the first interlayer insulating film 9, and a bit line contact plug 12 is formed by providing a contact hole in the second interlayer insulating film 11 over the drain region 7B. Then, a bit line 13 that connects to the bit line contact plug 12 is formed. Next, a third interlayer insulating film 14 that covers the bit line 13, a fourth interlayer insulating film 15, and a fifth interlayer insulating film 16 are formed. A capacitor 17 is formed in the fifth interlayer insulating film 16 and is connected to the contact plug 10 on the source region 7A via a capacitor contact plug 18. In this manner, the semiconductor device shown in FIG. 8 is manufactured.

The semiconductor device shown in FIG. 8 is applied to a DRAM element. A DRAM element basically consists of a memory cell and peripheral circuits, but FIG. 8 is a cross-sectional schematic view of a portion of a so-called memory cell portion. The memory cell portion shown in FIG. 8 is approximately constituted from a MOS transistor $Tr_1$ for a memory cell and the capacitor portion 17 that is connected to the MOS transistor $Tr_1$ via the contact plug 10 and the capacitor contact plug 18.

As shown in the cross-sectional structure of FIG. 8, the P-type well layer 5 is formed in the active region 3 that is partitioned by the element isolation region 2 in the semiconductor substrate 1, the source 7A and the gate 7B are formed spaced apart in the P-type well layer 5, and the gate electrode 6 is formed between the source 7A and the gate 7B.

The gate electrode 6 is formed by a multilayer film consisting of the polycrystal silicon film 6a and the high melting point metal film 6b, and as the polycrystal silicon film 6a it is possible to use a doped polycrystal silicon film that is formed by doping an impurity during film formation in the CVD method. As the high melting point metal film 6b it is possible to use a high-melting point metal such as tungsten and tungsten silicide (WSi).

Also, as shown in FIG. 8, the gate insulating film 4 is formed between the gate electrode 6 and the semiconductor substrate 1. The silicon nitride film 8 is formed around the gate electrode 6 that includes the side portion 6a. The silicon nitride film 8 that is positioned at the side portion 6a of the gate electrode 6 is a so-called sidewall. The silicon nitride film 8 makes contact with the end portions 4a of the gate insulating film 4. This silicon nitride film 8 is formed by repeatedly forming a silicon nitride layer by the LPCVD method and performing nitrogen exposure under a high temperature and low pressure. The hydrogen atom density in the film is lowered to less than 1 atom %.

The MOS transistor $Tr_1$ is thus constituted by the P-well layer 5, the source 7A, the drain 7B, the gate electrode 6, and the gate insulating film 4.

As shown in FIG. 8, the first interlayer insulating film 9 is formed on the semiconductor substrate 1, and the contact hole 9a is provided in the first interlayer insulating film 9. The contact plug 10 that is connected to the source 7A and the drain 7B is formed in this contact hole 9. The contact plug 10 is constituted from a polysilicon layer or an amorphous silicon layer.

The second interlayer insulating film 11 is laminated on the first interlayer insulating film 9, and the bit line contact plug 12 that is connected to the contact plug 10 is formed in the second interlayer insulating film 11. The bit line contact plug 12 is constituted by a Ti/TiN film and a metal layer consisting of tungsten being laminated. This Ti film reacts with the silicon that constitutes the bit line contact plug 12 to form titanium silicide.

The bit line 13 is formed so as to connect to the bit line contact plug 12. The bit line 13 is constituted by a laminated film that consists of tungsten nitride and tungsten.

The third interlayer insulating film 14 and the fourth interlayer insulating film 15 are formed so as to cover the bit line 13. The capacitor contact plug 18 is formed so as to connect to the contact plug 10 by passing through the second to fourth interlayer insulating films 11, 14, 15. The fifth interlayer insulating film 16 is formed on the fourth interlayer insulating film 15, and the capacitor portion 17 is formed so as to connect to the capacitor contact plug 18.

Figure 9:
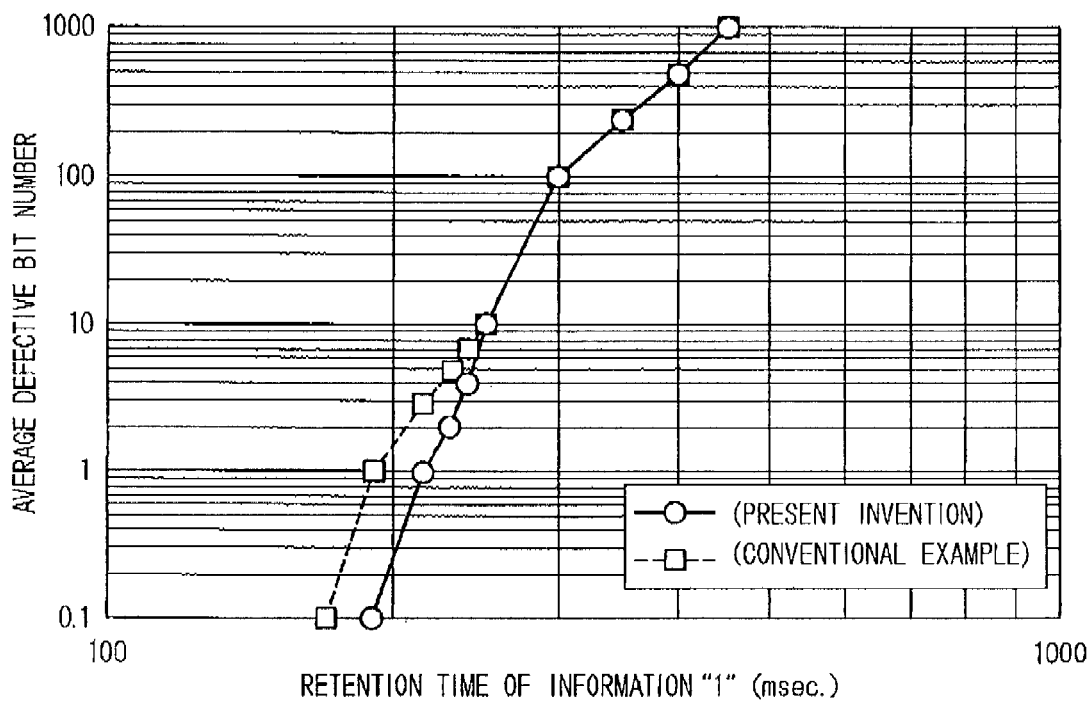
FIG. 9 is a graph that shows the relationship between the average defective bit number and the retention time of the information "1" in the embodiment of the present invention and a conventional example.
Figure 10:
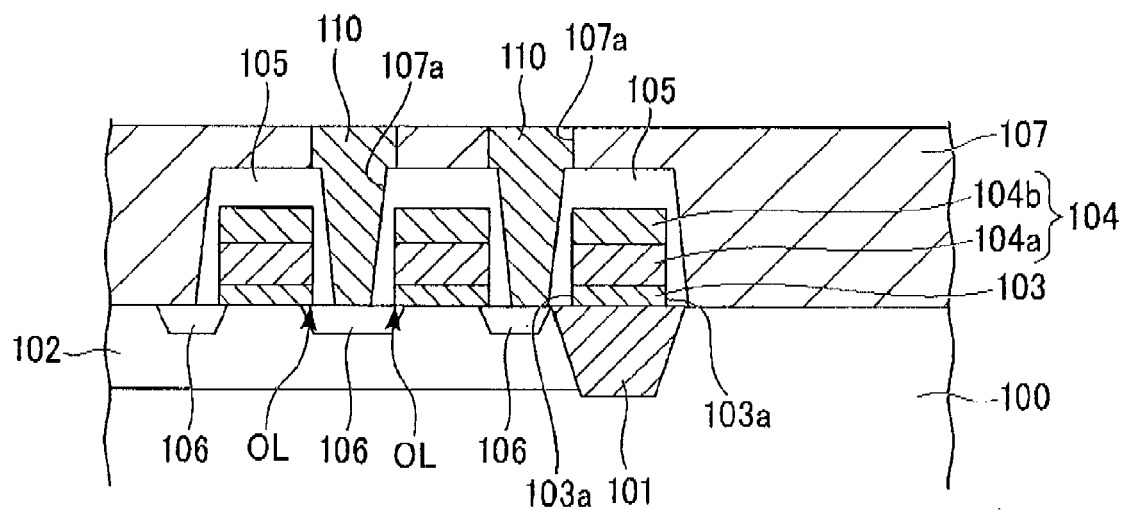
FIG. 10 is a cross-sectional view showing a portion of a conventional semiconductor device.

FIG. 9 is a graph of the relationship between the average defective bit number and the retention time of the information "1". In FIG. 9 a DRAM element according to the present invention (the example in the present invention) and a conventional DRAM element that omits the exposure process in nitrogen in the silicon nitride film formation step (conventional example) are compared. As shown in FIG. 9, the average defective bit number in the example in the present invention is reduced compared to the conventional example.

As described above, by repeating the step that forms a silicon nitride layer and the step that exposes the silicon nitride layer to nitrogen under a decompressed atmosphere according to the aforementioned method of manufacturing a semiconductor device, it is possible to reduce the number of Si—H bonds by expelling hydrogen atoms that are included in the silicon nitride layer. Thereby, it is possible to form the silicon nitride film 8 in which the hydrogen atom content percentage is 1 atom % or less. This is a substantial reduction from the hydrogen atom content percentage in the case of a silicon nitride film that is formed simply by the CVD) method in a conventional manner (5 atoms %). Since the silicon nitride film 8 in which the Si—H bonds are reduced is connected to the end portions 4a of the gate insulating film 4 that are exposed between the gate electrode 6 and the semiconductor substrate 1, there is no risk of an increase in leakage current in the overlap region OL of the gate and drain. Thereby, it is possible to manufacture a semiconductor device with excellent reliability.

Also, by reducing the number of Si—H bonds that are contained in the silicon nitride film 8, it is possible to reduce the variations in the threshold voltage of the MOS transistor $Tr_1$, and so possible to manufacture a high-quality semiconductor device.

Also, since the hydrogen density of the silicon nitride film 8 that covers the end portions 4a of the gate insulating film 4 is 1 atom % or less according to the aforementioned semiconductor device, there is no risk of an increase in leakage current in the overlap region OL of the gate and drain. Thereby, it is possible to increase the reliability of the semiconductor device.

In the case of applying the semiconductor device of the present embodiment to a DRAM element, since there is no risk of an increase in leakage current in the overlap region OL of the gate and drain, it is possible to raise the retention of the information "1". Thereby, it is possible to reduce the frequency of the refresh operation of the DRAM element, and so achieve a reduction in the power consumption of the DRAM element.

Also, by reducing the number of Si—H bonds that are contained in the silicon nitride film 8, it is possible to reduce the variations in the threshold voltage of the MOS transistor $Tr_1$.

What is claimed is:

1. A method of manufacturing a semiconductor device comprising the steps of:
    successively forming a gate insulating film and a gate electrode on a semiconductor substrate;
    forming a silicon nitride layer of a predetermined thickness by a low-pressure chemical vapor deposition method on a portion that covers the gate insulating film and the side portions of the gate electrode wherein the silicon nitride layer physically directly contacting sidewalls of the gate insulating film and the gate electrode;
    exposing the silicon nitride layer to nitrogen under a decompressed atmosphere; and
    forming a silicon nitride film that consists of a plurality of laminated silicon nitride layers by repeating the step of forming the silicon nitride layer and the step of exposing the silicon nitride layer to nitrogen.

2. The method of manufacturing a semiconductor device according to claim 1, wherein the silicon nitride film is formed so as to be connected to the end portions of the gate insulating film that are exposed between the semiconductor substrate and the gate electrode.

* * * * *